US011393682B2

(12) United States Patent
Gardner et al.

(10) Patent No.: US 11,393,682 B2
(45) Date of Patent: Jul. 19, 2022

(54) NANOWIRE WITH REDUCED DEFECTS

(71) Applicant: Microsoft Technology Licensing, LLC, Redmond, WA (US)

(72) Inventors: Geoffrey C. Gardner, West Lafayette, IN (US); Sergei V. Gronin, West Lafayette, IN (US); Raymond L. Kallaher, West Lafayette, IN (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 16/810,266

(22) Filed: Mar. 5, 2020

(65) Prior Publication Data

US 2021/0280417 A1    Sep. 9, 2021

(51) Int. Cl.
*H01L 21/02* (2006.01)

(52) U.S. Cl.
CPC .. *H01L 21/02603* (2013.01); *H01L 21/02304* (2013.01); *H01L 21/02543* (2013.01); *H01L 21/02546* (2013.01); *H01L 21/02549* (2013.01)

(58) Field of Classification Search
CPC ......... H01L 21/02603; H01L 21/02304; H01L 21/02543; H01L 21/02546; H01L 21/02549
USPC .......................................................... 257/9
See application file for complete search history.

(56) References Cited

U.S. PATENT DOCUMENTS

| | | | |
|---|---|---|---|
| 9,379,283 B2 * | 6/2016 | Cha | H01L 33/18 |
| 2014/0138611 A1 * | 5/2014 | Chung | H01L 29/775 |
| | | | 257/9 |
| 2014/0252478 A1 * | 9/2014 | Doornbos | H01L 29/785 |
| | | | 438/157 |
| 2017/0054021 A1 * | 2/2017 | Kunert | H01L 29/7846 |
| 2018/0226242 A1 * | 8/2018 | Kim | H01L 21/02444 |
| 2018/0277713 A1 * | 9/2018 | Ciechonski | H01L 21/0254 |
| 2020/0058489 A1 * | 2/2020 | Ohlsson | H01L 21/02647 |
| 2020/0075803 A1 * | 3/2020 | Danesh | H01L 33/62 |

FOREIGN PATENT DOCUMENTS

WO    2016209210 A1    12/2016

OTHER PUBLICATIONS

"International Search Report & Written Opinion issued in PCT Application No. PCT/US2012/014199", dated Apr. 6, 2021, 15 Pages.

* cited by examiner

*Primary Examiner* — David Vu
*Assistant Examiner* — Brandon C Fox
(74) *Attorney, Agent, or Firm* — Withrow & Terranova, P.L.L.C.

(57) ABSTRACT

A nanowire structure includes a substrate, a patterned mask layer on the substrate, and a nanowire. The patterned mask layer is on the substrate and includes an opening through which the substrate is exposed. The nanowire is on the substrate in the opening of the patterned mask layer. The nanowire includes a buffer layer on the substrate, a defect filtering layer on the buffer layer, and an active layer on the defect filtering layer. The defect filtering layer is a strained layer. By providing the defect filtering layer between the buffer layer and the active layer of the nanowire, defects present in the buffer layer can be prevented from propagating into the active layer. Accordingly, defects in the active layer of the nanowire are reduced, thereby improving the performance of the nanowire structure.

19 Claims, 6 Drawing Sheets

NANOWIRE WITH REDUCED DEFECTS

FIELD OF THE DISCLOSURE

The present disclosure is related to nanowires, and in particular to nanowires with reduced defects and methods for manufacturing the same.

BACKGROUND

Nanowires show great promise for applications in quantum computing. Unfortunately, it is difficult to manufacture high quality nanowires. Conventional processes for manufacturing nanowires include selective-area-growth (SAG) wherein nanowires are selectively grown directly on a substrate through a patterned mask layer. To function properly, nanowires must be a conducting semiconductor material such as indium arsenide, indium antimonide, or indium arsenide antimonide. The substrate on which the nanowires are grown must be an insulating material such as gallium arsenide, gallium antimonide, indium phosphide, gallium phosphide, silicon, or germanium. There is often a large difference in the crystal lattice constant of the substrate and the nanowires. This crystal lattice mismatch causes crystalline defects in the nanowires during growth such as dislocations and stacking faults. The crystalline defects can penetrate the nanowires and in turn decrease the performance of the resulting nanowires.

In light of the above, there is a need for nanowires with reduced crystalline defects and methods of manufacturing the same.

SUMMARY

In one embodiment, a nanowire structure includes a substrate, a patterned mask layer on the substrate, and a nanowire. The patterned mask layer includes an opening through which the substrate is exposed. The nanowire is on the substrate in the opening of the patterned mask layer. The nanowire includes a buffer layer on the substrate, a defect filtering layer on the buffer layer, and an active layer on the defect filtering layer. The defect filtering layer is a strained layer. By providing the defect filtering layer between the buffer layer and the active layer of the nanowire, defects present in the buffer layer can be prevented from propagating into the active layer. Accordingly, defects in the active layer of the nanowire are reduced, thereby improving the performance of the nanowire structure.

In one embodiment, a thickness of the defect filtering layer is between 2 ML (monolayers) and 10 nm. The defect filtering layer may comprise one or more of indium gallium arsenide (InGaAs), aluminum arsenide (AlAs), and aluminum antimonide (AlSb). The buffer layer may comprise one or more of gallium arsenide antimonide (GaAsSb), indium gallium arsenide (InGaAs), indium aluminum arsenide (InAlAs), and aluminum gallium antimonide arsenide (AlGaSbAs). The active layer may comprise one or more of indium arsenide (InAs), indium antimonide (InSb), and indium arsenide antimonide (InAsSb). The substrate may comprise one or more of gallium arsenide (GaAs), gallium antimonide (GaSb), gallium arsenide antimonide (GaAsSb), indium phosphide (InP), gallium phosphide (GaP), silicon (Si), and germanium (Ge). A thickness of the buffer layer may be between 20 nm and 200 nm. A thickness of the active layer may be between 10 nm and 200 nm. A thickness of the substrate may be between 200 μm and 500 μm The buffer layer, the defect filtering layer, and the active layer may be grown via a selective area growth process. The defect filtering layer may be configured to prevent defects in the buffer layer from propagating into the active layer. The buffer layer may include any number of buffer layers and the defect filtering layer may include any number of defect filtering layers. The buffer layers may be alternated with the defect filtering layers to further decrease the likelihood of defect propagation.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
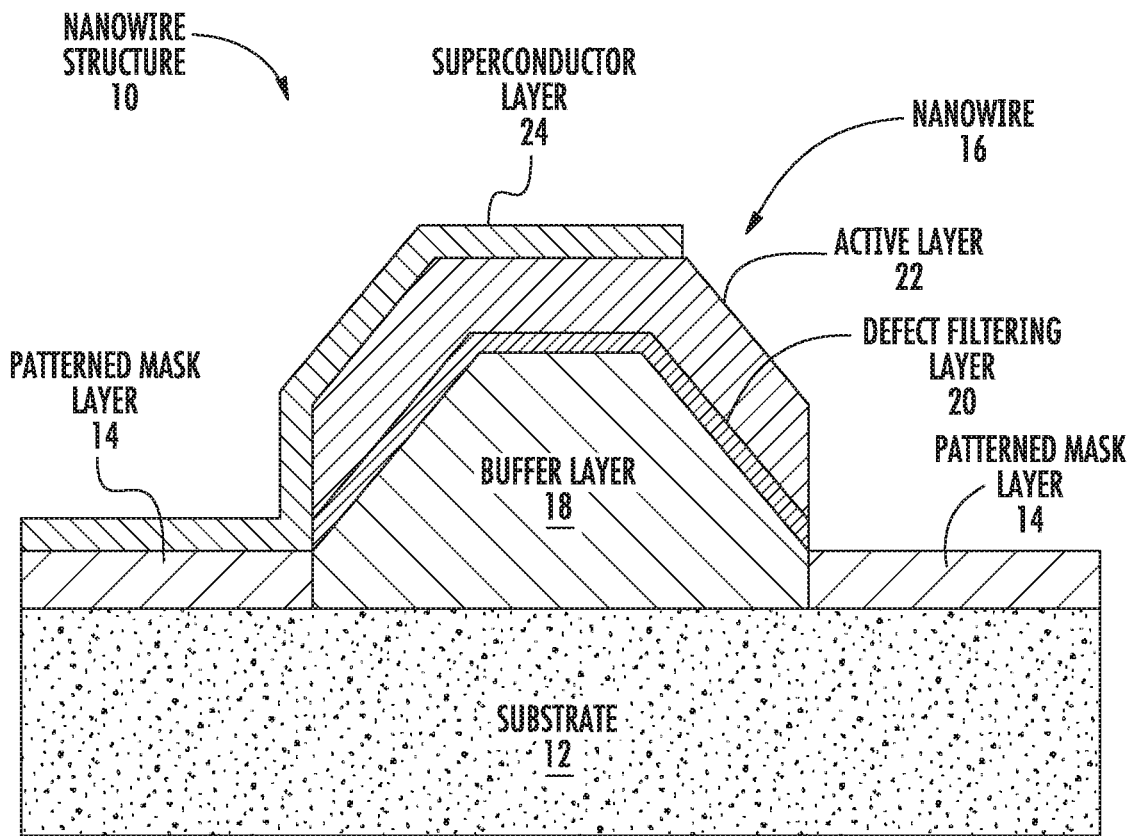
FIG. 1 is a diagram illustrating a nanowire structure according to one embodiment of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

FIG. 1 shows a nanowire structure 10 according to one embodiment of the present disclosure. The nanowire structure 10 includes a substrate 12, a patterned mask layer 14 on the substrate 12, and a nanowire 16 on the substrate 12 through an opening in the patterned mask layer 14. The nanowire 16 includes a buffer layer 18 on the substrate 12, a defect filtering layer 20 on the buffer layer 18, and an active layer 22 on the defect filtering layer 20. A superconductor layer 24 is on the active layer 22. The defect filtering layer 20 is a strained layer. As discussed herein, a strained layer is a layer in which the atoms of the material thereof are stretched beyond their normal interatomic distance. Due to the material properties and thickness of the defect filtering layer 20, it prevents the defects that may occur in the buffer layer 18 from propagating into the active layer 22. Fewer defects in the active layer 22 results in improved performance of the nanowire structure 10, for example, when the nanowire structure 10 is operated as part of a quantum computing device such as a qubit.

In various embodiments, the substrate 12 may comprise one or more of gallium arsenide, gallium antimonide, gallium arsenide antimonide, indium phosphide, gallium phosphide, silicon, and germanium. The patterned mask layer 14 may comprise a dielectric such as silicon dioxide. While shown as a single layer, the buffer layer 18 may comprise several different layers. These layers may comprise one or more of gallium arsenide antimonide (GaAsSb), indium gallium arsenide (InGaAs), indium aluminum arsenide (InAlAs), and aluminum gallium antimonide arsenide (AlGaSbAs). The defect filtering layer 20 may comprise one of indium gallium arsenide (InGaAs), aluminum arsenide (AlAs), and aluminum antimonide (AlSb). The active layer 22 may comprise one of indium arsenide (InAs), indium antimonide (InSb), and indium arsenide antimonide (InAsSb). The superconductor layer 24 may comprise one of aluminum (Al), lead (Pb), niobium (Nb), indium (In), tin (Sn), and vanadium (V). A thickness of the superconductor layer 24 may be between 3 nm and 30 nm.

In various embodiments, a thickness of the buffer layer 18 may be between 20 nm and 200 nm. A thickness of the defect filtering layer 20 may be between 2 ML (monolayers) and 10 nm. A thickness of the active layer 22 may be between 10 nm and 200 nm. A thickness of the substrate 12 may be between 200 μm and 500 μm. The nanowire 16 may have a thickness between 20 nm and 300 nm. Further, the nanowire 16 may have a diameter on the order of a nanometer ($10^{-9}$ meters) or a ratio of length to width greater than 1000.

Figure 2:
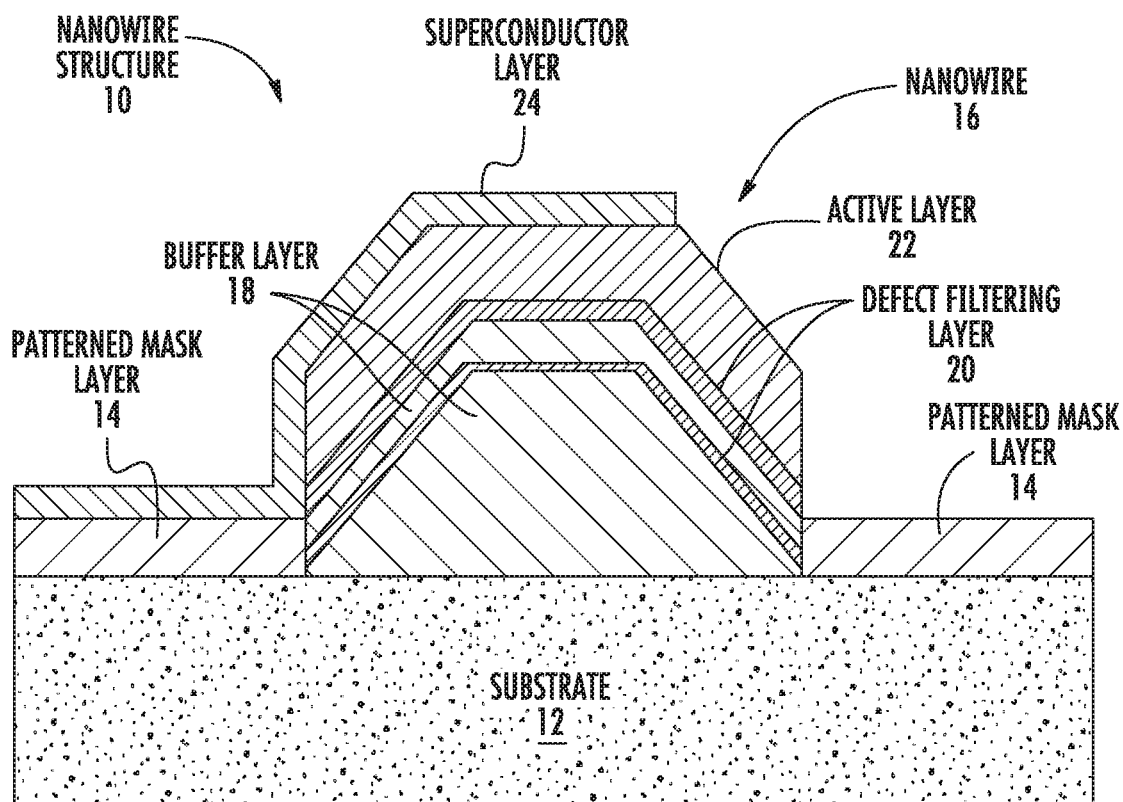
FIG. 2 is a diagram illustrating a nanowire structure according to one embodiment of the present disclosure.

In some embodiments, the nanowire 16 includes more than one defect filtering layer 20. When the nanowire 16 includes more than one defect filtering layer 20, each one of the layers may be alternated with a buffer layer 18 as shown in FIG. 2. While only two buffer layers 18 and two defect filtering layers 20 are shown alternating between the substrate 12 and the active layer 22 in FIG. 2, the nanowire 16 may include any number of buffer layers 18 and defect filtering layers 20 without departing from the principles of the present disclosure.

Figure 3:
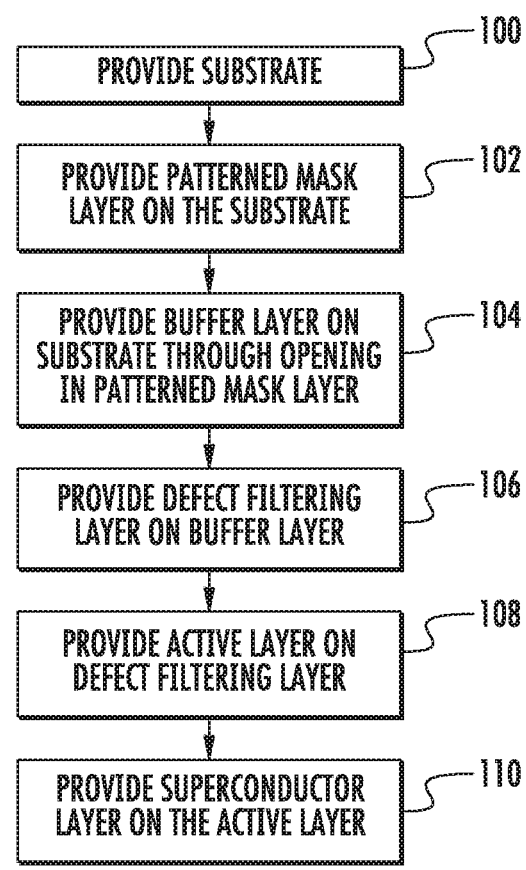
FIG. 3 is a flow diagram illustrating a method for manufacturing a nanowire structure according to one embodiment of the present disclosure.
Figure 4A:
FIGS. 4A through 4F are diagrams illustrating a method for manufacturing a nanowire structure according to one embodiment of the present disclosure.
Figure 4B:
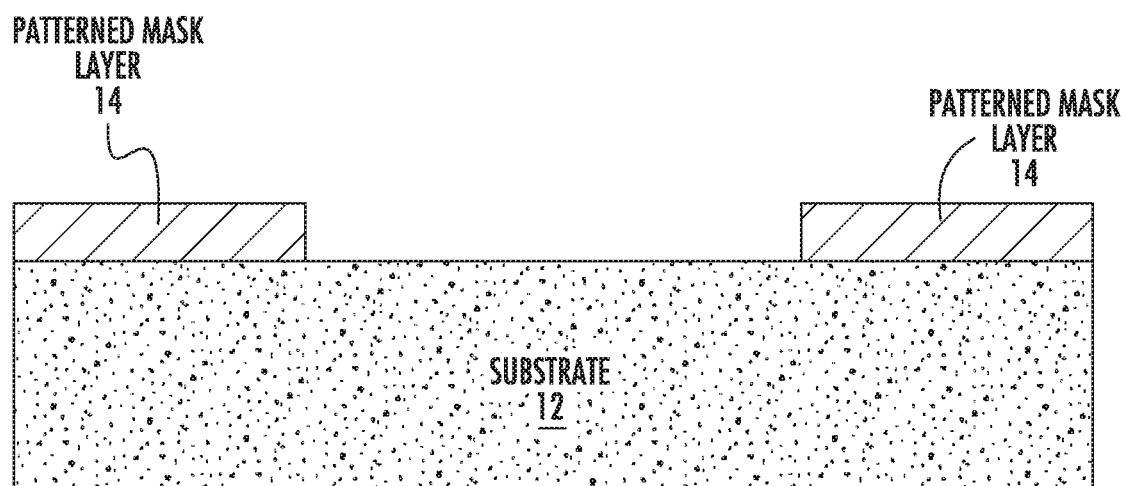
Figure 4C:
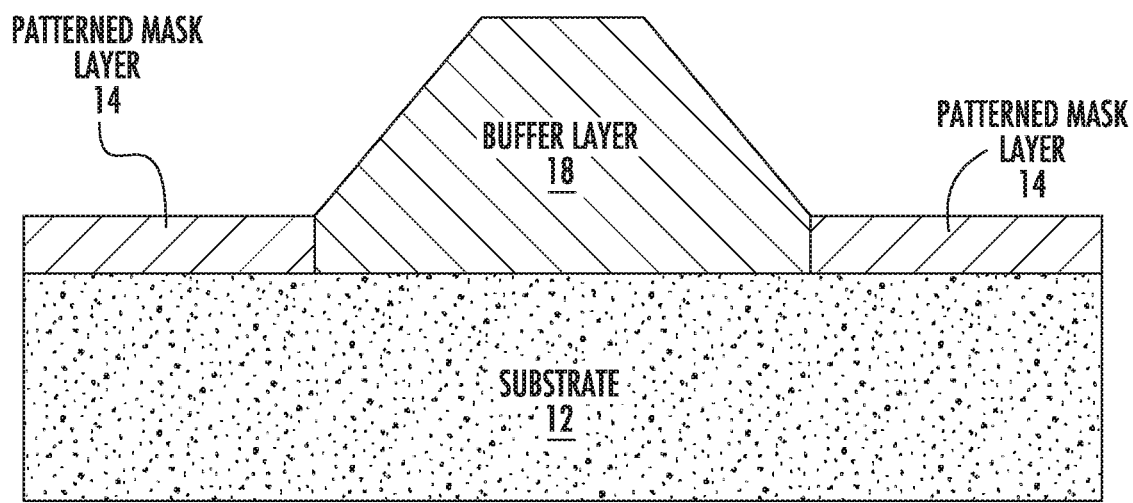
Figure 4D:
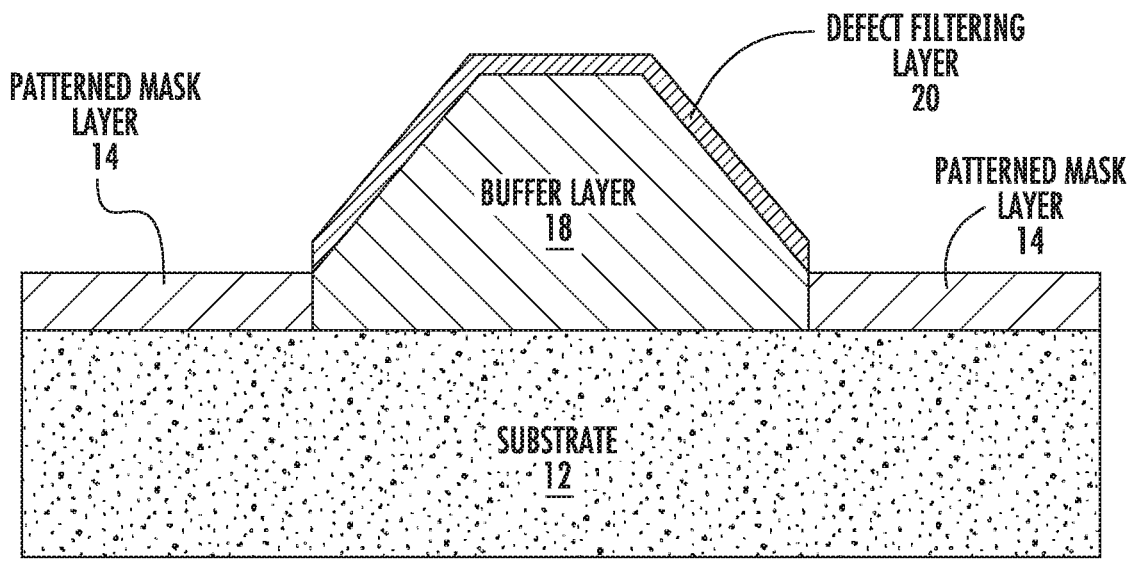
Figure 4E:
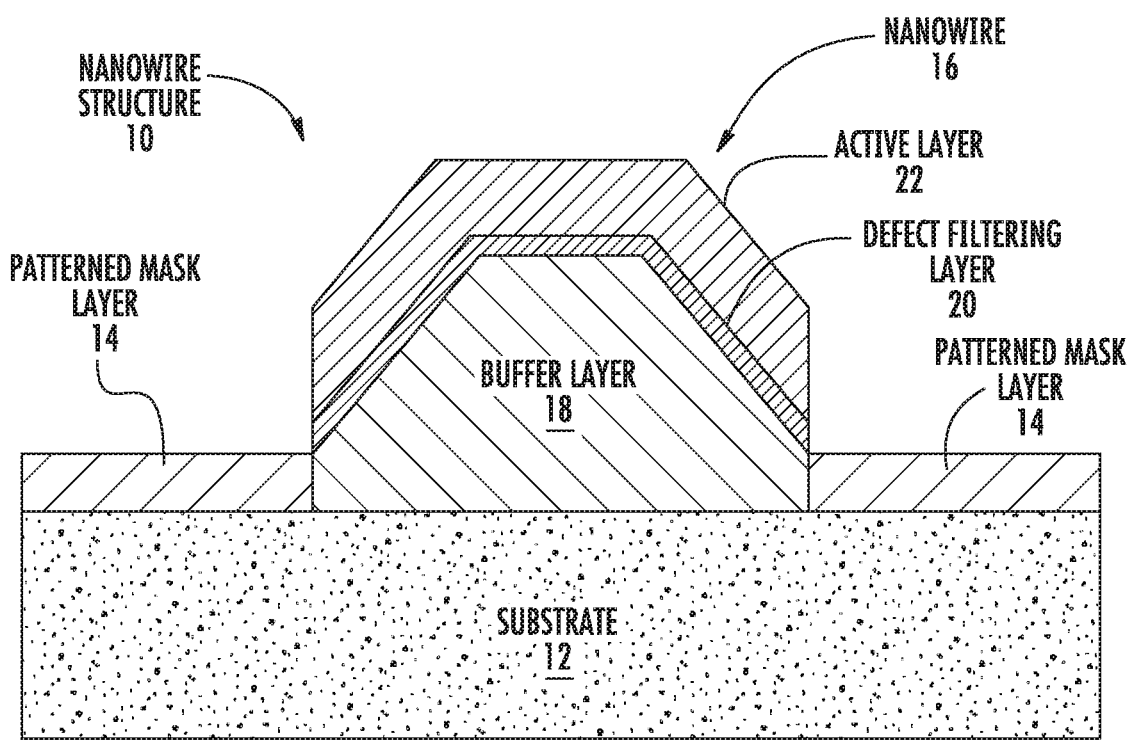
Figure 4F:
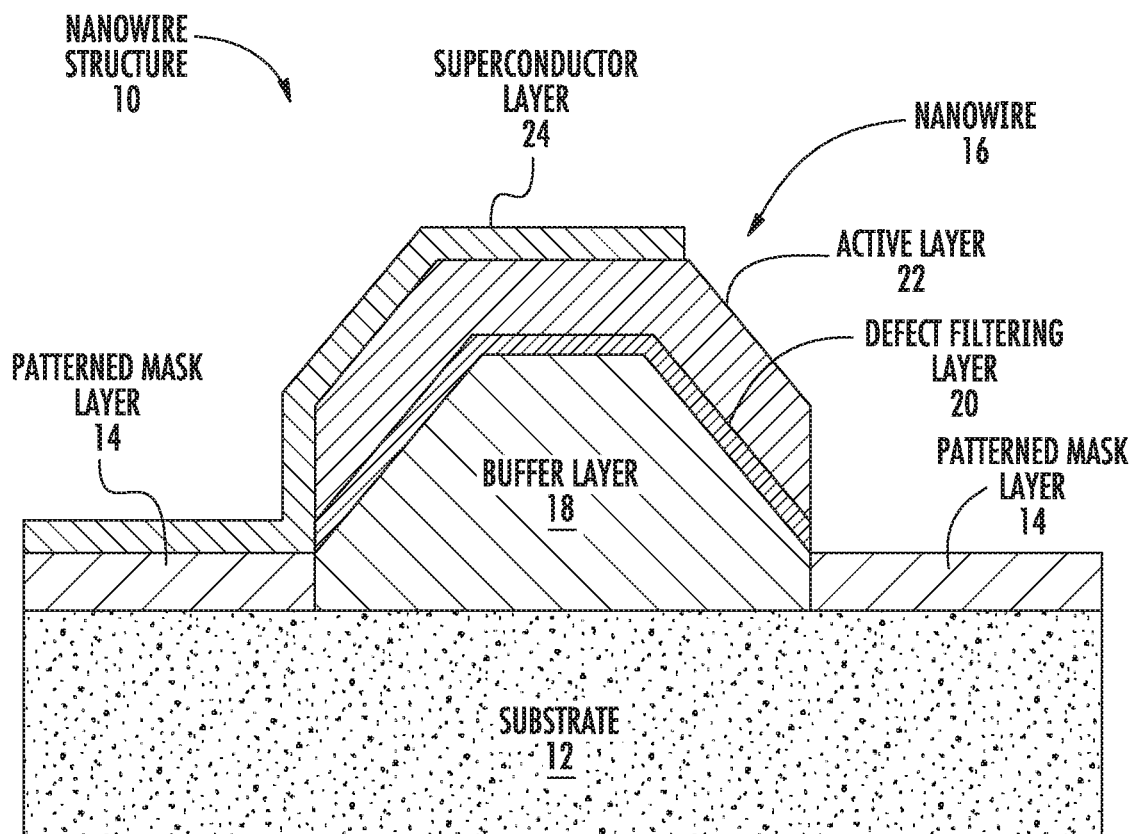

FIG. 3 is a flow diagram illustrating a method for manufacturing the nanowire structure 10 according to one embodiment of the present disclosure. FIGS. 4A through 4F illustrate the method and thus are discussed in conjunction with the flow diagram in FIG. 3. The substrate 12 is provided (block 100 and FIG. 4A). The patterned mask layer 14 is provided on the substrate 12 (block 102 and FIG. 4B). In various embodiments, providing the patterned mask layer 14 may comprise depositing a mask layer over the entirety of the substrate 12 as a blanket layer and then patterning the layer, for example, by a lithography process. The buffer layer 18 is provided on the substrate 12 through an opening in the patterned mask layer 14 (block 104 and FIG. 4C). The defect filtering layer 20 is provided on the buffer layer 18 (block 106 and FIG. 4D). The active layer 22 is provided on the defect filtering layer 20 (block 108 and FIG. 4E). The buffer layer 18, the defect filtering layer 20, and the active layer 22 may be provided by a growth process such as a selective area growth (SAG) process. The superconductor layer 24 is provided on the active layer 22, and, in some embodiments extends over a portion of the patterned mask layer 14 (block 110 and FIG. 4F). The superconductor layer 24 may be provided by any suitable deposition process.

The completed nanowire structure 10 may form part of a quantum computing device such as a qubit. By using the defect filtering layer 20 to reduce the number of defects in the active layer 22, the performance of the nanowire structure 10 and thus the resulting quantum computing device may be improved.

Those skilled in the art will recognize improvements and modifications to the preferred embodiments of the present disclosure. All such improvements and modifications are considered within the scope of the concepts disclosed herein and the claims that follow.

What is claimed is:
1. A nanowire structure comprising:
a substrate;
a patterned mask layer on the substrate, the patterned mask layer having an opening through which the substrate is exposed; and a nanowire on the substrate through the opening in the patterned mask layer, the nanowire comprising:
  a plurality of buffer layers on the substrate;
  a plurality of defect filtering layers, wherein the plurality of buffer layers is alternated with the plurality of defect filtering layers, each of the plurality of defect filtering layers is a strained layer, and each of the plurality of defect filtering layers is on a corresponding one of the plurality of buffer layers; and
  an active layer on the plurality of defect filtering layers.

2. The nanowire structure of claim 1 wherein a thickness of each of the plurality of defect filtering layers is between 2 monolayers (ML) and 10 nm.

3. The nanowire structure of claim 2 wherein the plurality of defect filtering layers comprises one of indium gallium arsenide, aluminum arsenide, and aluminum antimonide.

4. The nanowire structure of claim 3 wherein the plurality of buffer layers comprises one or more of gallium arsenide antimonide, indium gallium arsenide, indium aluminum arsenide, and aluminum gallium antimonide arsenide.

5. The nanowire structure of claim 4 wherein the active layer comprises one or more of indium arsenide, indium antimonide, and indium arsenide antimonide.

6. The nanowire structure of claim 5 wherein the substrate comprises one or more of gallium arsenide, gallium antimonide, gallium arsenide antimonide, indium phosphide, gallium phosphide, silicon, and germanium.

7. The nanowire structure of claim 5 wherein:
  a thickness of each of the plurality of buffer layers is between 20 nm and 200 nm;
  a thickness of the active layer is between 10 nm and 200 nm; and
  a thickness of the substrate is between 200 µm and 500 µm.

8. The nanowire structure of claim 5 wherein the plurality of buffer layers, the defect filtering layer, and the active layer are grown via a selective area growth process.

9. The nanowire structure of claim 1 wherein the plurality of defect filtering layers is configured to prevent defects in the plurality of buffer layers from propagating into the active layer.

10. A method for manufacturing a nanowire structure, the method comprising:
  providing a substrate;
  providing a patterned mask layer on the substrate, the patterned mask layer having an opening through which the substrate is exposed;
  providing a plurality of buffer layers on the substrate through the opening in the patterned mask layer;
  providing a plurality of defect filtering layers, wherein providing the plurality of buffer layers and the plurality of defect filtering layers is in an alternating fashion, each of the plurality of defect filtering layers is on a corresponding one of the plurality of buffer layers, and each of the plurality of defect filtering layers is a strained layer; and
  providing an active layer on the plurality of defect filtering layers.

11. The method of claim 10 wherein each of the plurality of defect filtering layers is provided having a thickness between 2 ML and 10 nm.

12. The method of claim 11 wherein the plurality of defect filtering layers comprises one of indium gallium arsenide, aluminum arsenide, and aluminum antimonide.

13. The method of claim 12 wherein the plurality of buffer layers comprises one or more of gallium arsenide antimonide, indium gallium arsenide, indium aluminum arsenide, and aluminum gallium antimonide arsenide.

14. The method of claim 13 wherein the active layer comprises one or more of indium arsenide, indium antimonide, and indium arsenide antimonide.

15. The method of claim 14 wherein the substrate comprises one or more of gallium arsenide, gallium antimonide, gallium arsenide antimonide, indium phosphide, gallium phosphide, silicon, and germanium.

16. The method of claim 14 wherein:
  each of the plurality of buffer layers is provided having a thickness between 20 nm and 200 nm;
  the active layer is provided having a thickness between 10 nm and 200 nm; and
  the substrate is provided having a thickness between 200 µm and 500 µm.

17. The method of claim 14 wherein the plurality of buffer layers, the plurality of defect filtering layers, and the active layer are grown via a selective area growth process.

18. The method of claim 10 wherein the plurality of defect filtering layers is configured to prevent defects in the plurality of buffer layers from propagating into the active layer.

19. A nanowire structure comprising:
  a substrate;
  a patterned mask layer on the substrate, the patterned mask layer having an opening through which the substrate is exposed; and
  a nanowire on the substrate through the opening in the patterned mask layer, the nanowire comprising:
    a buffer layer on the substrate;
    a defect filtering layer on the buffer layer, wherein the defect filtering layer is a strained layer;
    an active layer on the defect filtering layer, and
    a superconductor layer, which partially covers the active layer and the patterned mask layer.

* * * * *